(12) United States Patent
Wang et al.

(10) Patent No.: US 10,804,821 B2
(45) Date of Patent: Oct. 13, 2020

(54) APPARATUS AND METHOD FOR MONITORING THE RELATIVE RELATIONSHIP BETWEEN THE WAFER AND THE CHUCK

(71) Applicant: Advanced Ion Beam Technology, Inc., Hsin-Chu (TW)

(72) Inventors: Te-Min Wang, Tainan (TW); Yu-Ho Ni, Tainan (TW); Chun-Chieh Lin, Tainan (TW); Chien-Chung Hou, Tainan (TW); Cheng-Mao Chien, Tainan (TW)

(73) Assignee: ADVANCED ION BEAM TECHNOLOGY, INC., Hsin-Chu (TW)

( * ) Notice: Subject to any disclaimer, the term of this patent is extended or adjusted under 35 U.S.C. 154(b) by 524 days.

(21) Appl. No.: 15/689,158

(22) Filed: Aug. 29, 2017

(65) Prior Publication Data

US 2018/0131293 A1 May 10, 2018

(30) Foreign Application Priority Data

Nov. 4, 2016 (TW) .............................. 105135806 A (51) Int. Cl.
*H02N 13/00* (2006.01)
*H01L 21/687* (2006.01)
(Continued)

(52) U.S. Cl.
CPC ......... *H02N 13/00* (2013.01); *G01R 27/2605* (2013.01); *G01R 31/2808* (2013.01);
(Continued)

(58) Field of Classification Search
CPC ................ H02N 13/00; G01R 31/2808; G01R 31/2831; G01R 27/2605; H01L 21/6833;
(Continued)

(56) References Cited

U.S. PATENT DOCUMENTS

| 5,996,415 | A | * | 12/1999 | Stanke | ................. | G01N 29/041 374/119 |
| 7,064,565 | B1 | * | 6/2006 | Xu | ........................ | G01R 31/129 324/762.05 |
| 7,328,126 | B2 | * | 2/2008 | Chamness | ............ | G05B 23/024 700/108 |
| 2010/0032096 | A1 | | 2/2010 | Yu et al. | | |

(Continued)

FOREIGN PATENT DOCUMENTS

CN 201710762246.6 8/2017
JP 2017214194 5/2018
(Continued)

OTHER PUBLICATIONS

Taiwan Patent Office "Office Action" dated May 2, 2017, Taiwan.

*Primary Examiner* — Dharti H Patel
(74) *Attorney, Agent, or Firm* — WPAT, PC (57) ABSTRACT

An apparatus and a method for monitoring the relative relationship between the wafer and the chuck is provided, especially for monitoring whether the wafer is sticky on the chuck when the wafer is de-chucked. The lift pins may be extended outside the chuck to separate the wafer and the chuck when the wafer is de-chucked. By detecting the capacitance between the de-chucked wafer and the chuck, especially by comparing the detected capacitance with the capacitance that the wafer is held by the chuck, one may determine whether the wafer is sticky on the chuck, or even whether the wafer is properly supported by the lift pins. Accordingly, an early alarm may be issued if the wafer is sticky or improperly removed. Besides, by controlling a switch electrically connected to a lift pin that contacted the wafer, the charges at the wafer may be eliminated.

6 Claims, 10 Drawing Sheets

(51) Int. Cl.
*H01L 21/67* (2006.01)
*H01L 21/683* (2006.01)
*G01R 31/28* (2006.01)
*G01R 27/26* (2006.01)
*H05F 3/02* (2006.01)

(52) U.S. Cl.
CPC .... *G01R 31/2831* (2013.01); *H01L 21/67288* (2013.01); *H01L 21/6833* (2013.01); *H01L 21/68742* (2013.01); *H05F 3/02* (2013.01)

(58) Field of Classification Search
CPC ......... H01L 21/67288; H01L 21/68742; H01L 21/6831; H01L 21/67259; H05F 3/02
USPC ........................................................ 361/234
See application file for complete search history.

(56) References Cited

U.S. PATENT DOCUMENTS

| | | | |
|---|---|---|---|
| 2010/0142113 A1* | 6/2010 | Lee | H01L 21/6831 361/234 |
| 2010/0208409 A1* | 8/2010 | Bluck | H01L 21/683 361/234 |
| 2011/0051306 A1 | 3/2011 | Wang et al. | |
| 2011/0111601 A1* | 5/2011 | Okita | H01L 21/67069 438/716 |
| 2015/0124979 A1 | 5/2015 | Chien | |

FOREIGN PATENT DOCUMENTS

| | | |
|---|---|---|
| TW | 201007880 | 2/2010 |
| TW | 201110254 | 3/2011 |
| TW | 201518739 | 5/2015 |
| TW | 106129423 | 8/2017 |

* cited by examiner

APPARATUS AND METHOD FOR MONITORING THE RELATIVE RELATIONSHIP BETWEEN THE WAFER AND THE CHUCK

BACKGROUND OF INVENTION

The present invention relates to an apparatus and method for monitoring the relative relationship between a wafer and a chuck, and more particularly, to an apparatus and method for monitoring the relative relationship between a wafer and a chuck by detect the capacitance-related signal related to the relative geometric relationship between a wafer and a chuck.

Chuck, especially electrostatic chuck (e-chuck), is commonly used to hold a treated wafer during processing. For example, electrostatic chucks are commonly used to hold the wafers during ion implantation process. Before starting the process, the wafer must be placed on the chuck or be held by the chuck. Once the processing is completed, the wafer is then removed away from the chuck or de-chucked.

In any case, the residual electrical charges that appear on the wafer during processing may still remain a little on the wafer surface, (including the back and front surfaces), after the end of the processing procedure for the wafer. Therefore, sometimes the wafer will be sticky on the chuck and cannot be properly removed from the chuck or will be broken or damage when removing the wafer from the chuck, especially when the chuck is an electrostatic chuck that accumulates a large amount of charges at the wafer during processing.

In summary, there is a need to develop apparatus and methods to monitor the relative relationship between the wafer and the chuck to produce early alarm before wafer sticky on, wafer breakage, or other damage occurs or even before it occurs.

SUMMARY OF THE INVENTION

The present invention provides an apparatus and method for monitoring the relative relationship between a wafer and a chuck, in particular for an apparatus and method for monitoring a wafer being disposed on a chuck or held by a chuck or sticky on a chuck, or removed from the chuck. The present invention achieves such a device and method by changing the distance between the wafer and the chuck correspondingly when the relative relationship between the wafer and the chuck should be changed. Since the capacitance between the wafer and the chuck varies depending on the relative relationship between the wafer and the chuck, for example, the wafer is disposed on the chuck or held by the chuck, or is de-chuck from the chuck or sticky on the chuck, or removed from the chuck. The distance between the wafer and the chuck changes correspondingly. Therefore, by detecting the capacitance value of the actual capacitance between the wafer and the chuck and comparing the capacitance value of the ideal capacitance with respect to the relationship between each wafer and the chuck, one can detected whether or not the wafer is sticky on the chuck and the geometry relationship between the wafer and the chuck easily.

The apparatus and method of the present invention use a lift pin that can extend from the interior to the outside of the chuck to support the wafers and, if desired, separate the wafers from the chuck. An original alternating current (AC) signal is input to the chuck and the corresponding AC signal is output from the chuck, wherein the corresponding AC signal is a function of both the original AC signal and the relative relationship between the wafer and the chuck. Therefore, by comparing the original AC signal and the corresponding AC signal, one can get a capacitance-related signal.

Thus, when the wafer is sticky on the chuck (that is, when the wafer is not properly de-chucked and/or is not properly removed from the chuck), the detected capacitance-related signal will notable be different from the capacitor-related signal when the wafer is held or when it is removed from the chuck. In this way, early alarm can be made immediately so that the operation of the wafer processing can be paused (or even stopped) and/or the operator can artificially handle the current situation to minimize possible damage.

Alternatively, in order to change the distance between the wafer and the chuck simply when the relative relationship between the wafer and the chuck changes, any one of the lift pins can be mechanically connected to a spring, or even a washer because the attraction between the wafer and the chuck changes as the relative relationship between the wafer and the chuck changes.

Further, in order to ensure that the wafer can be properly removed from the chuck, in particular when the wafer sticky on is detected, a point of the tip used to contact the wafer is formed by a conductive material and electrically connected to the zero electric potential point through a switch. Whereby the wafers can be electrically connected to the zero electric potential point at the time when need to eliminate the charges at the wafer, such as the time before the wafer is to be removed from the chuck. By means of turning on or off the switch, the charges are conducted away from the wafer. But the wafer is isolated from the zero electric potential point to avoid affect the measurements when measuring the capacitance-related signal. Of course, the lift pin that connected to the zero electric potential point through the switch and the lift pin used to separate the wafer from the chuck can be the same and perform different functions at different times by turning on or off the switch, or different lift pin and perform different functions respectively.

BRIEF DESCRIPTION OF THE DRAWINGS

The present invention will now be specified with reference to its preferred embodiment illustrated in the drawings, in which.

DESCRIPTION OF THE INVENTION

The embodiments of the invention will be described below with reference to the drawings. It should be understood that the specific embodiments described herein are merely illustrative of the invention and are not intended to limit the invention. The figures reveal some details. It should be understood that the details of the figures may be different from those that have been disclosed in words unless explicitly limiting the characteristics in specification.

Figure 1:
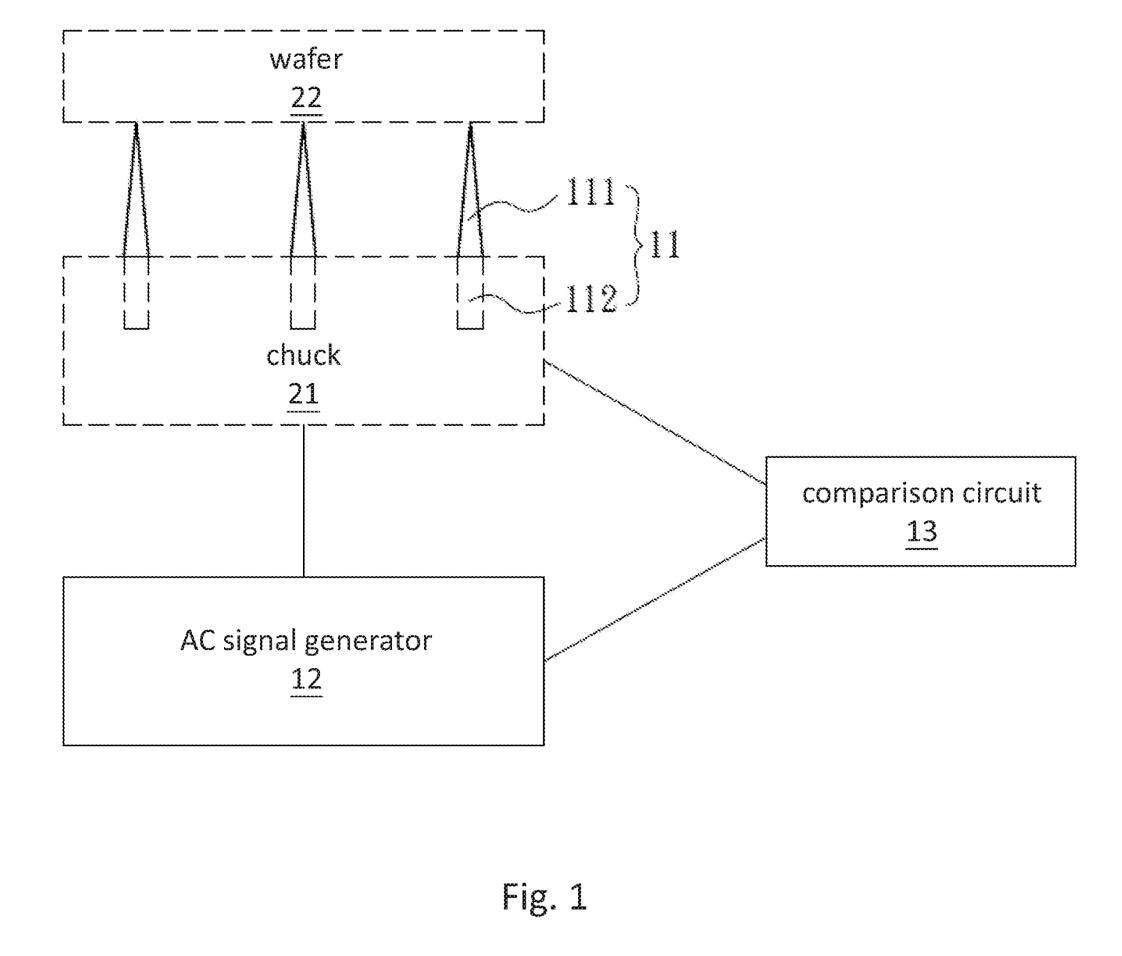
FIG. 1 is a schematic view of the structure of an embodiment of the present invention to monitoring the relative relationship between a wafer and a chuck.

As shown in FIG. 1, a structure of the present invention for monitoring the relative relationship between a wafer and a chuck. Such a structure has at least a lift pin assembly 11 which may extend from the interior to the outside of a chuck 21 for holding the wafer 22, an AC signal generator 12 for outputting the original AC signal, and a comparison circuit 13 for comparing the original AC signal with corresponding AC signal transmitting from the chuck 21. The lift pin assembly 11 includes one or more lift pin 111 accommodated in the chuck 21 that may extend outside the chuck 21 and one or more support units 112 for respectively supporting and used to move the lift pin 111. In addition, the AC signal generator 12 is electrically coupled to the chuck 21 and the comparison circuit 13, respectively, and the comparison circuit 13 is electrically coupled to the AC signal generator 12 and the chuck 21, respectively. Of course, the chuck 21 and the wafer 22 are merely for expressing the relationship of the apparatus of the present invention with the chuck 21 and the wafer 22. The apparatus of the present invention does not need to limit the details of both the chuck 21 and the wafer 22. For example, the chuck 21 is often an electrostatic chuck, but it may also be a mechanical chuck or other form of chuck.

In the condition of holding the wafer 22, the wafer 22 and the chuck 21 are mechanically in contact with each other and the lift pin assembly 11 is located inside the chuck 21. However, in the condition of de-chucked the wafer 22, the wafer 22 and the chuck 21 are separated by the lift pin assembly 11 and at least one of the lift pins 111 extends outside the chuck 22. Further, in the condition where the wafer 22 is removed, the wafer 22 is far away from the chuck 21 and is not supported by the lift pin assembly 11. Obviously, the capacitance between the wafer 22 and the chuck 21 should have a first value in the first condition, a second value in the second condition and a third value in the third condition. Therefore, since the distance between the wafer 22 and the chuck 21 (or the relative geometrical relationship between the wafer 22 and the chuck 21) is different from the previous three conditions, the actual capacitance between the wafer and chuck will naturally be different from any one of the first value, the second value and the third value.

In contrast, in conventional prior art, it generally only measures the capacitance between the wafer and the chuck when the wafer and the chuck are mechanically in contact with each other, and thus cannot clearly distinguish from the two conditions that the wafer being held by the chuck or the wafer being sticked on the chuck.

In other words, the present invention can detect different capacitance value between the wafer 22 and the chuck 21 when separating the chuck 21 and the wafer 22 by the lift pin assembly 11 at de-chucked condition, and when the wafer 22 is held by the chuck 21. And the present invention provides detecting different capacitance values under various conditions when the wafer 22 is sticky on the chuck 21. Thus, the present invention can more accurately and more sensitively detect whether the wafer sticky on the chuck.

Figure 2A:
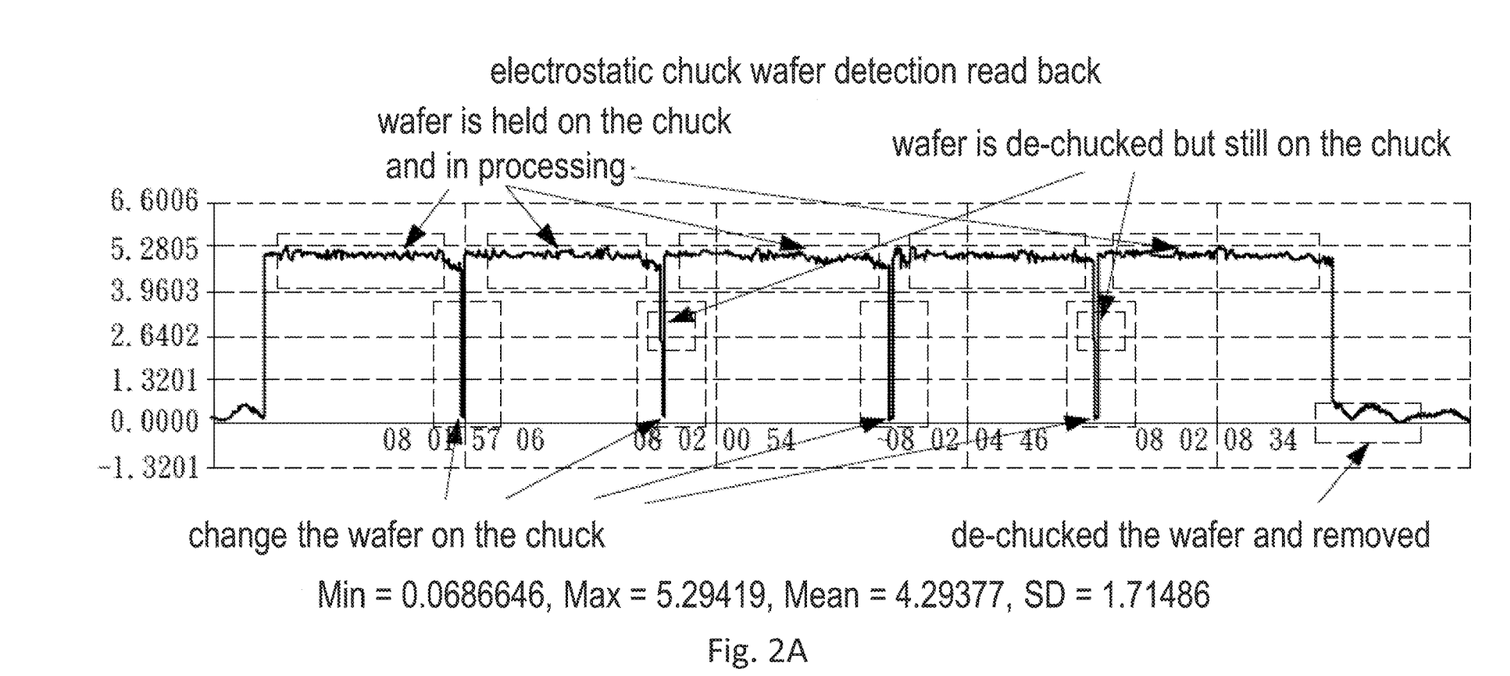
FIGS. 2A and 2B is an example of the capacitance-related signals detected by the conventional technique and the present invention, respectively.
Figure 2B:
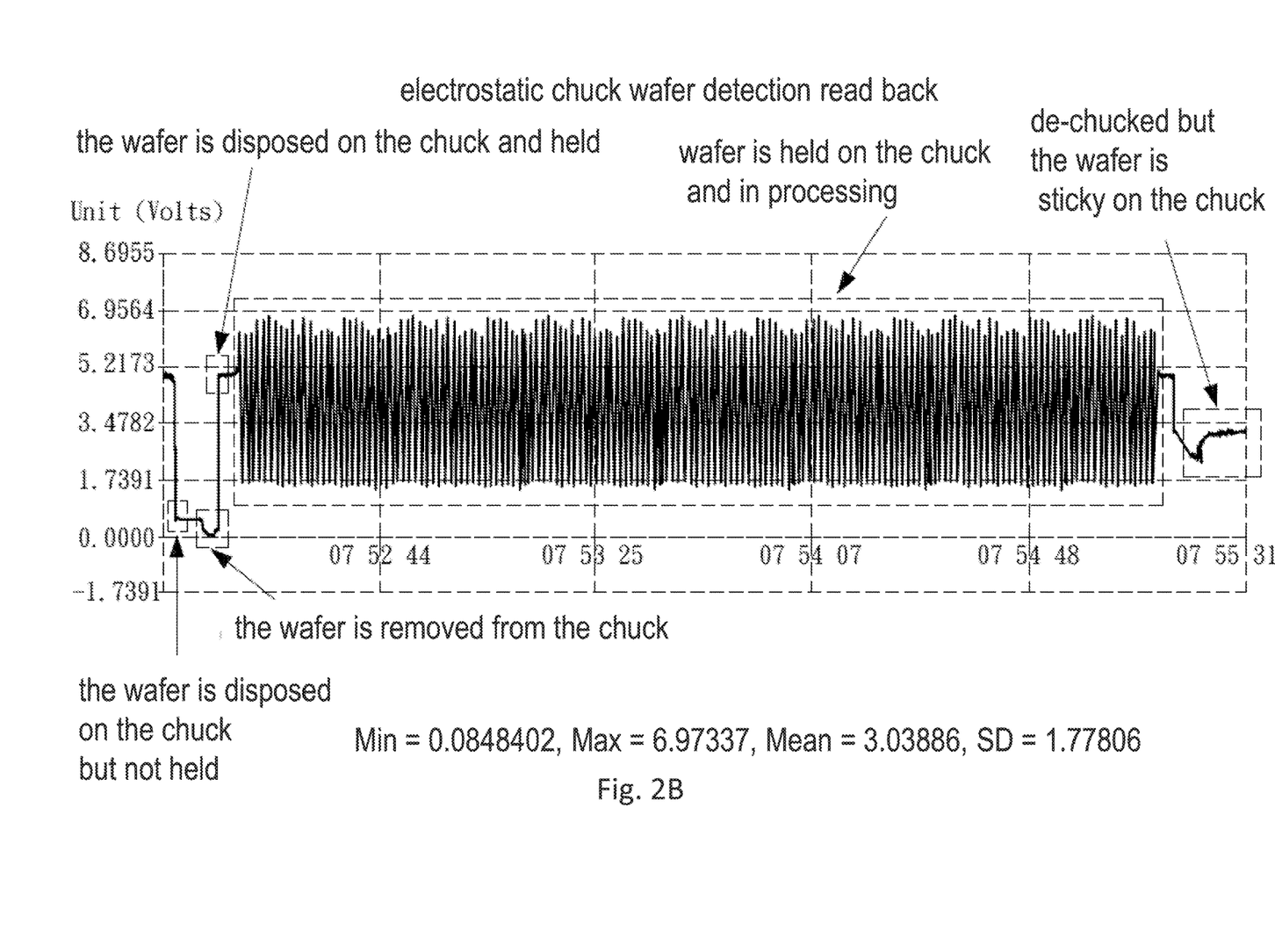

The advantages of the present invention can be exemplified by comparing the FIG. 2A and FIG. 2B. FIG. 2A shows an example of a capacitance-related signal detected using the conventional technique. When the wafer is held on the chuck and subjected to a wafer processing program (such as an ion-implanted), approximately the same capacitance-related signal value (which will fluctuate slightly with the progress of the wafer processing) will be detected. It is clear and detectable that the signal value approaches zero when the wafer is removed from the chuck between two adjacent cycles. But it is not every time to detect the substantially halved value of the capacitance-related signal when the wafer is de-chucked but still on the chuck. After all the wafer processing procedures are completed, it is possible to detect that the capacitance-related signal is about zero when the wafer is de-chucked and removing from the chuck. It cannot effectively detect any different of capacitance-related signal when the wafer is sticky on the chuck. FIG. 2B shows an example of the capacitance-related signal detected using the present invention. It shows that the value of the detected capacitance-related signal is oscillated within a range when the wafer is held on the chuck and subjected to a wafer processing program (such as an ion-implanted). It is also possible to find a significantly different of the values of detected capacitance-related signal when the wafer is disposed on the chuck without being held after the previous wafer processing, when the wafer is removed from the chuck after the previous wafer processing, and when the wafer is held by the chuck before this wafer processing procedure. At the end of the wafer processing, It can be seen that the value of the capacitance-related signal is reduced, and even a value of the capacitance-related signal that is significantly different from the previous conditions can be detected when the wafer is sticky on the chuck. That is, in the present invention, it is possible to more efficiently detect whether or not a wafer is sticky on the chuck. In FIG. 2A and FIG. 2B, the unit of the amplitude of the capacitance-related signal is Volts, and the minimum value (Min), maximum value (Max), mean value (Mean), and standard deviation (SD) of the capacitance-related signal in the detection period is also shown. Of course, in order to simplify the relevant discussion, all the other details of the two examples are not described here.

Some optional details of the lift pin assembly 11 used in the present invention are described below. In some examples, the lift pin assembly 11 has a plurality of lift pins 111 to separate the wafer from the chuck. In some example, the lift pin assembly 11 has only one lift pin 111 to separate the wafer from the chuck. In some sample, lift pin assembly 11 have at least three lift pins 111 to stably support the wafer when the wafer is separated from the chuck. It should be noted that there has no need to limit the length, cross-sectional area and shape (and even other geometric factors) of these lift pins 111 in the present invention. In some examples, at least one of these lift pins 111 is mechanically supported by a spring, where different lift pins 111 are mechanically supported by different springs, respectively. Moreover, in some examples, each spring is mechanically supported by a washer, and different springs are mechanically supported by different washers, respectively. The lift pin assembly 11 can be located inside the chuck 21 when the wafer 22 is held by the chuck 21, wherein the elastic force of the springs together with the elastic force of the washer is smaller than the attraction force between the wafer 22 and the chuck 21 (or as smaller than the sum of this attraction force and the weight of the wafer 22). In addition, the lift pins 111 of the lift pin assembly 11 accommodated in the chuck 21 can extend from the interior to the outside of the chuck 21 when the wafer 22 is not held (de-chucked) by the chuck 21, wherein the elastic force of the springs, together with the elastic force of the washer is at least greater than the weight of the wafer 22 (or the force that can push the wafer 22 away from the chuck 21 when the wafer 22 is not held). The distance between the chuck 21 and the wafer 22 can be changed simply and effectively by moving the lift pin 111 with the support unit 112 forming by a spring (even a washer). In any case, the details of both the lift pins 111 and the support unit 112 are not the limitation of the present invention. For example, in some unillustrated examples, the lift pin 111 and the support unit 112 may be integrated into a telescopic-like structure. In addition, in order to reduce the affection to the capacitance between the wafer 22 and the chuck 21 to change the relation of inversely proportional to the distance between the chuck 21 and the wafer 22, in some samples, each lift pin 111 is a dielectric lift pin so that the wafer 22 and the chuck 21 can be electrically isolated when they are separated from each other. Also, in some other examples, each lift pin 111 has a dielectric point such that the lift pin 111 mechanically contacts the wafer 22 through the dielectric point.

Figure 2C:
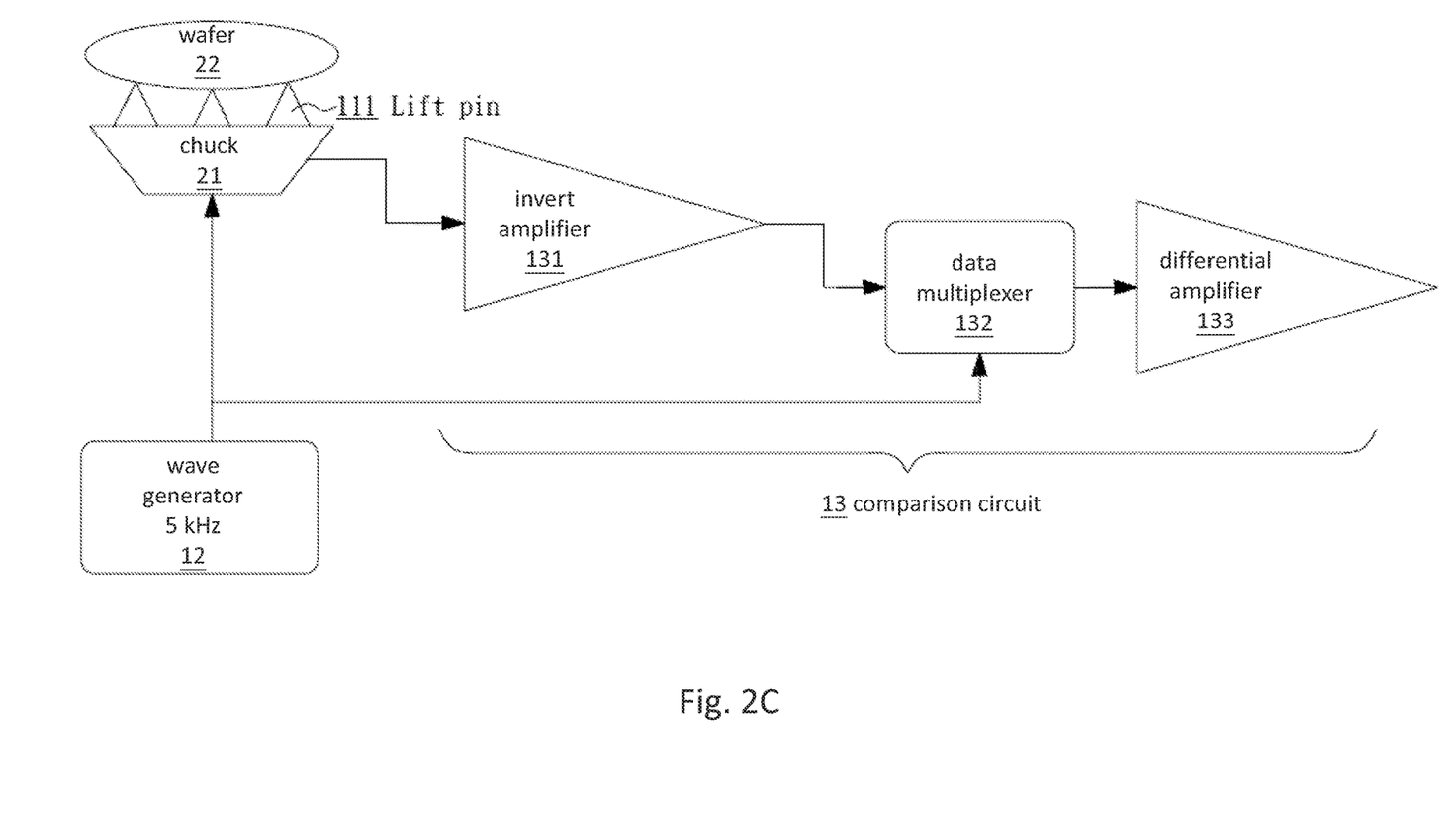
FIG. 2C is an example of an AC signal generator and a comparison circuit of the apparatus of the present invention.
Figure 2D:
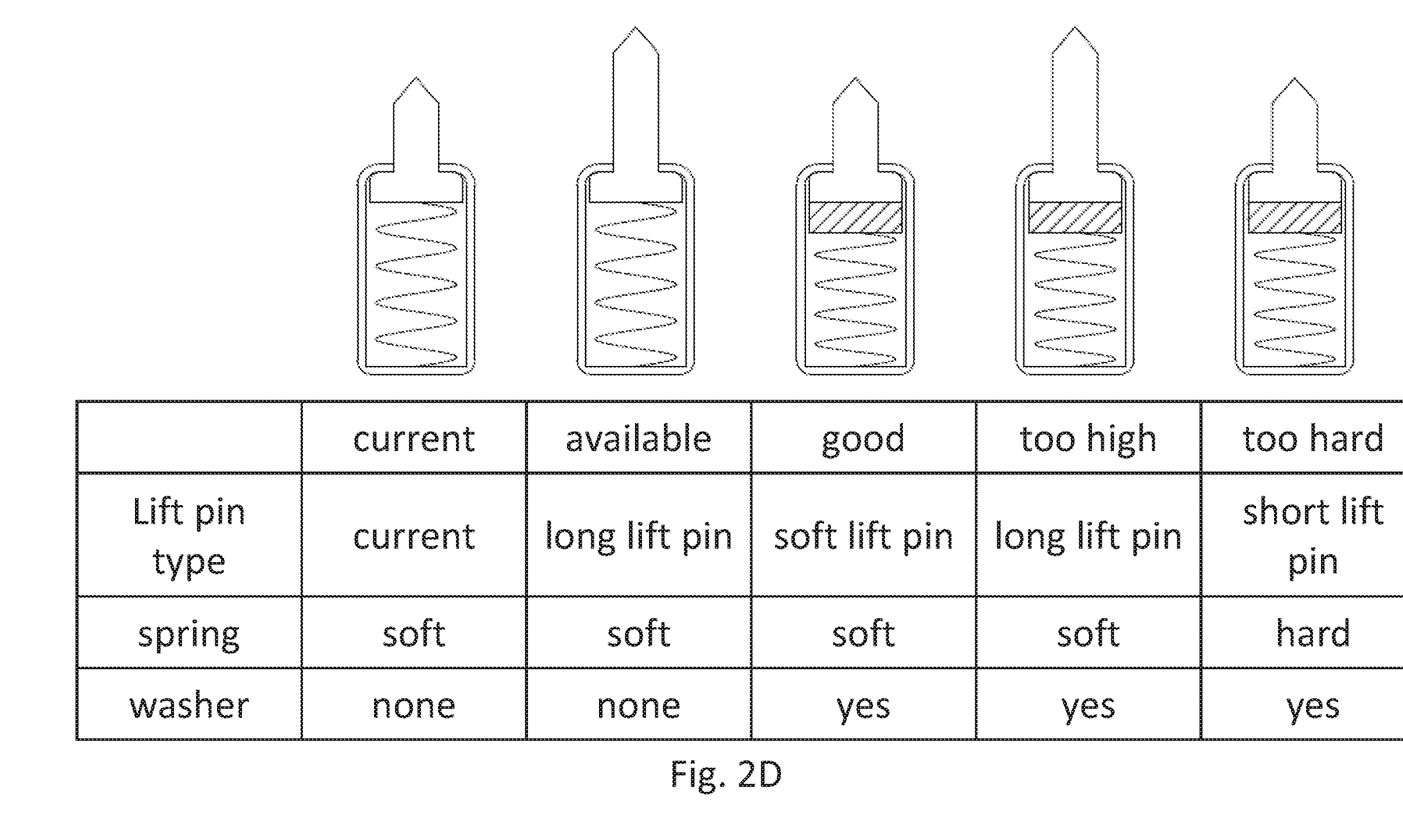
FIG. 2D shows some examples of the pin and support unit, wherein the different examples have different lengths, different elastic springs, and with or without washer.

In addition, for example only, FIG. 2C shows an example of the AC signal generator 12 and the comparison circuit 13 proposed by the present invention. In this illustrated example, the AC signal generator 12 is a wave generator and is configured to generate a clock wave with an output frequency of 5 kHz. The comparison circuit 13 has an invert amplifier 131, a data multiplexer 132, and a differential amplifier 133. Whereby the corresponding AC signal is output from the chuck 21 and inverted, and then compared with the original AC signal (i.e., the clock wave of frequency 5 kHz). After that, the comparison result is amplified and converted into a capacitance-related signal. For simplicity of illustration, only the lift pins 111 in the lift pin assembly 11 is shown here. By way of example only, as shown in FIG. 2D, by comparing the different springs with different lengths or different elasticity or with washer or without washer, a better combination for the detection results of the wafer and the chuck relationship is to use a short lift pin, a soft spring (lower elasticity coefficient) and a washer. In this example, the details of the dimensions, contours, and materials of the lift pin and the spring are not specified, but the present invention does not need to limit these details of the lift pin and the spring.

Incidentally, the present invention does not need to limit the details of both the AC signal generator 12 and the comparison circuit 13. Any known existing, developing or future occurrence circuit for generating AC signal and/or comparing AC signal can be used. One reason is that monitoring the relative relationship between the wafer and the chuck in capacitance by detecting the changes of one or more AC signals is a known technology. For example, U.S. Pat. Nos. 5,103,367, 5,436,790, 5,872,694, 6,075,395, 6,430,022 and 6,377,060 are some related published documents. That is, it has some well-known examples to realize the AC signal generator 12 and the comparison circuit 13. It should be noted that some of the relevant published documents use terms such as "capacitance measuring circuit" or "capacitance measurement circuit" to refer to the AC signal used to generate the capacitance for measuring and a device that detects the change in AC signal that reflects the amount of capacitance change. Another reason is that the present invention improves the accuracy and sensitivity of capacitance measurement by changing the distance between the wafer and the chuck when the relative relationship between the wafer and the chuck is changing from being held to de-chucked and/or from de-chucked to being held. Therefore, the details of both the AC signal generator 12 and the comparison circuit 13 are not important to the present invention.

Figure 3A:
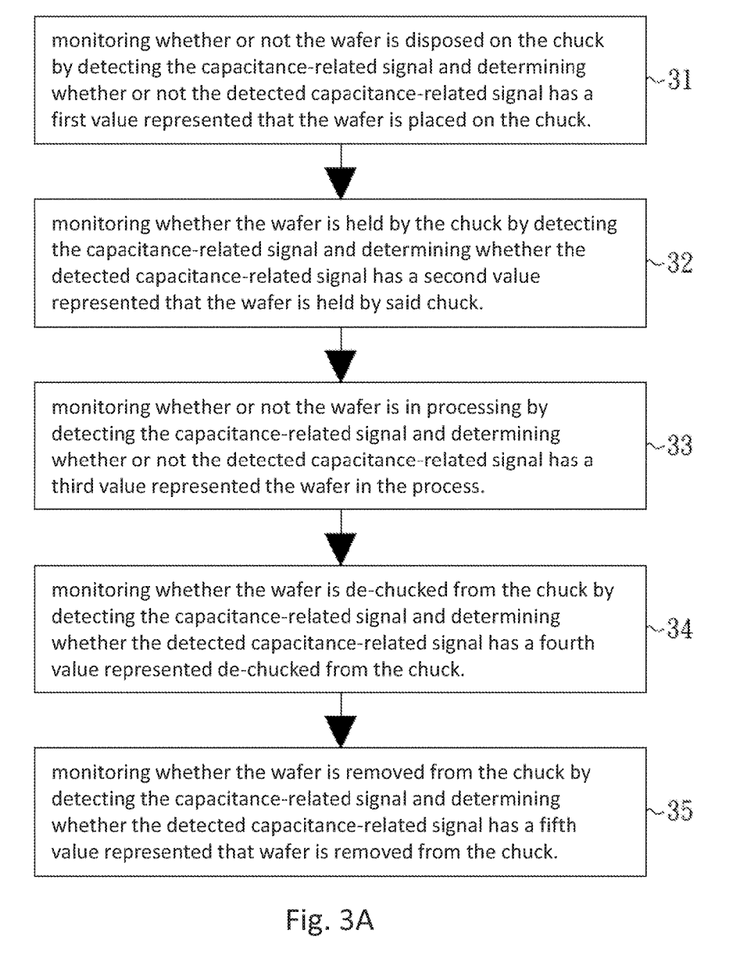
FIGS. 3A and 3B are schematic views of the two methods of monitoring the relative relationship between the wafer and the chuck proposed by the present invention.

FIG. 3A schematically shows a method of monitoring the relative relationship between a wafer and a chuck proposed by the present invention. First, as shown in step block 31, monitoring whether or not the wafer is disposed on the chuck by detecting the capacitance-related signal and determining whether or not the detected capacitance-related signal has a first value represented that the wafer is placed on the chuck. As shown in step block 32, monitoring whether the wafer is held by the chuck by detecting the capacitance-related signal and determining whether the detected capacitance-related signal has a second value represented that the wafer is held by said chuck. As shown in step block 33, monitoring whether or not the wafer is in processing by detecting the capacitance-related signal and determining whether or not the detected capacitance-related signal has a third value represented the wafer in the process. As shown in step block 34, monitoring whether the wafer is de-chucked from the chuck by detecting the capacitance-related signal and determining whether the detected capacitance-related signal has a fourth value represented de-chucked from the chuck. As shown in step block 35, monitoring whether the wafer is removed from the chuck by detecting the capacitance-related signal and determining whether the detected capacitance-related signal has a fifth value represented that wafer is removed from the chuck. In addition, although it is not particularly shown in step block 31 to step block 35, but the wafer should be separated from the chuck in the ideal condition when the wafer is de-chucked by the chuck, and the chuck should be mechanically in contact with the chuck in the ideal condition when the wafer is held by the chuck. Thus, in the actual case, when the wafer is sticky on the chuck (as if wafer had not been completely separated from the chuck and only partially mechanically contacted with the chuck), the present invention could distinguished the condition that the wafer is sticky on the chuck from other relative relationship between the wafer and the chuck by the fact that the capacitance values corresponding to the relative relationship between the wafer and the chuck are not the same, and the capacitance-related signal when the wafer is sticky on the chuck is not the same as the first value to the fifth value (since the capacitance between the wafer and the chuck is different from the first value to the fifth value when the wafer is sticky on the chuck).

Figure 3B:
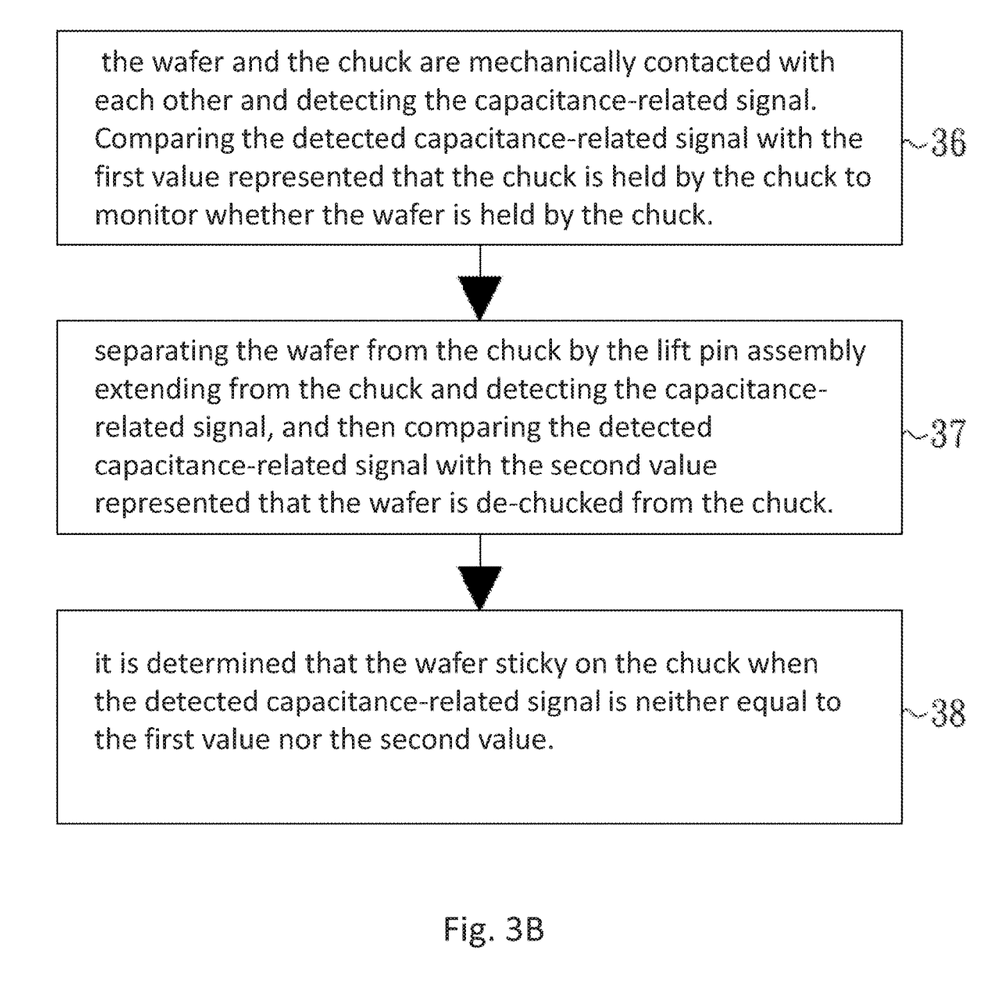

FIG. 3B summarizes another method of the present invention to monitor the relative relationship between a wafer and a chuck. As shown in step 36, the wafer and the chuck are mechanically contacted with each other and detecting the capacitance-related signal. Comparing the detected capacitance-related signal with the first value represented that the chuck is held by the chuck to monitor whether the wafer is held by the chuck. As shown in step 37, separating the wafer from the chuck by the lift pin assembly extending from the chuck and detecting the capacitance-related signal, and then comparing the detected capacitance-related signal with the second value represented that the wafer is de-chucked from the chuck. As shown in step 38, it is determined that the wafer sticky on the chuck when the detected capacitance-related signal is neither equal to the first value nor the second value. It is apparent that, as shown in FIG. 2A, 2B, since the wafer and the chuck are separated from each other by the lift pin assembly in step 37, it is possible to detect more efficiently in step 37 than the conventional technique that whether the wafer has been de-chucked by the chuck. At step 38 the technique of present invention is more sensitive and more accurately detecting whether the wafer is sticky on the chuck after de-chuck the wafer from the chuck (one may detects a value of the capacitance-related signal different from the first value or the second value, but a value between the first values and the second value.)

Of course, since it is possible to detect whether or not the wafer adheres to the suction cup, the present invention may have a number of alternative options. Some examples (not shown in the figures) issue early warnings when the capacitance-related signal does not match any of these values, for example, an early alarm when the wafer sticky on the chuck. For example, since converting the capacitance-related signal from one value to another value needs some duration, in different embodiments, an early alarm may be issued when the capacitance-related signals is not equal to these values (That is, an early warning is issued immediately when the capacitance-related signal is not equal to any of these values), or an early warning may be issued when the capacitance-corresponding signals does not equal to any one of these values for a duration exceeds the first threshold period (The early warning is issued after a period in which the capacitance-related signal is continuously not equal to any of these values exceeds the first threshold period.) Similarly, in some unillustrated examples, the processing of the wafer is suspended when the capacitance-related signal is not equal to any of these values or when the capacitance-related signal is not equal to any of these values for a duration exceeding the second threshold period. Similarly, in some unillustrated examples, the action of removing the wafer from the chuck is paused when the capacitance-related signal is not equal to any of these values or when the capacitance-related signal is not equal to any of these values for a duration exceeding the second threshold period.

Since the present invention can monitor whether the wafer is sticky on the chuck more efficiently than the conventional technique, it is also possible to actively minimize the danger because of the sticky of the wafer on the chuck due to charges appearing on the chuck. For example, a plasma shower may be used to neutralize the charges on the chuck (particularly the electrostatic chuck), especially when the wafer is just sticky onto the chuck. For example, the polarity of the electrode located inside the chuck may be reversed when the chuck is an electrostatic chuck, particularly when the wafer is just sticky onto the chuck.

In addition, the method of the present invention to monitor the relative relationship between the wafer and the chuck does not need to limit how the capacitance-related signal is generated and how the wafer and the chuck are separated from each other. The above described apparatus for monitoring the relative relationship between the wafer and the chuck may be applied to implement this method, but the present method does not necessarily use the device described above. In fact, any hardware, any firmware, and/or any software that can be used to implement capacitor-related signals and separate wafers and chuck can be used to implement this method.

It is important to emphasize that in addition to be used to monitor whether the wafer is sticky on the chuck, the present invention can monitor the relative relationship between the wafer and the chuck, such as whether the wafer is held and whether the wafer is de-chucked or other relative relationship between the wafer and chuck. While the above discussion focuses on how to monitor whether the wafer is sticky on the chuck, since the present invention can separate the wafer and the chuck as needed to create some significantly different capacitance values (that is, some significantly different capacitance-related signals,) the present invention may have other applications. Here, the present invention can effectively monitor the different relative relationship between wafers and chucks by detecting the actual capacitance-related signals and then comparing the signals with the ideal capacitance-related signals.

Further, since there is charges at the wafer when the wafer is sticky on the chuck, and the present invention is separated the wafer from the chuck by a lift pin when de-chucked the wafer, it is possible to detect more accurately and more sensitively than the conventional technique whether or not wafer sticking occurs, some embodiments of the present invention may also utilize a lift pin contacted with the wafer to conduct the electrical charges away from the wafer to improve or even eliminate wafer sticking.

Figure 4A:
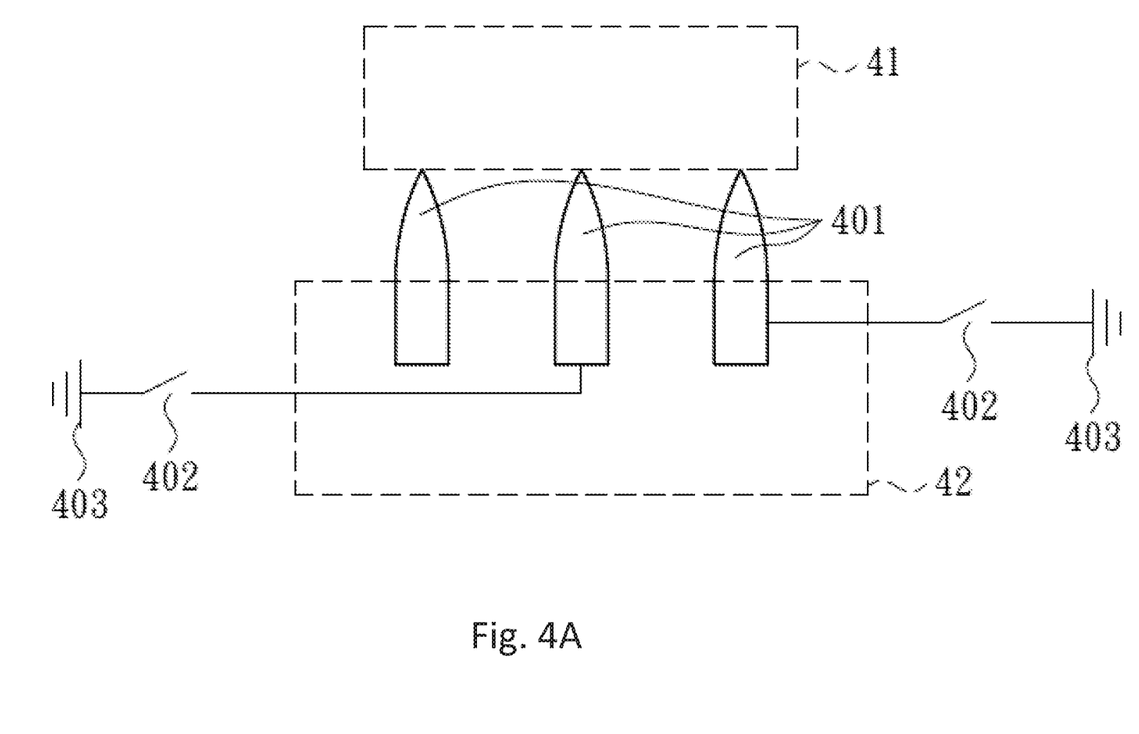
FIGS. 4A and 4B are schematic views of the structure for eliminating the charges at the wafer of the present invention.
Figure 4B:
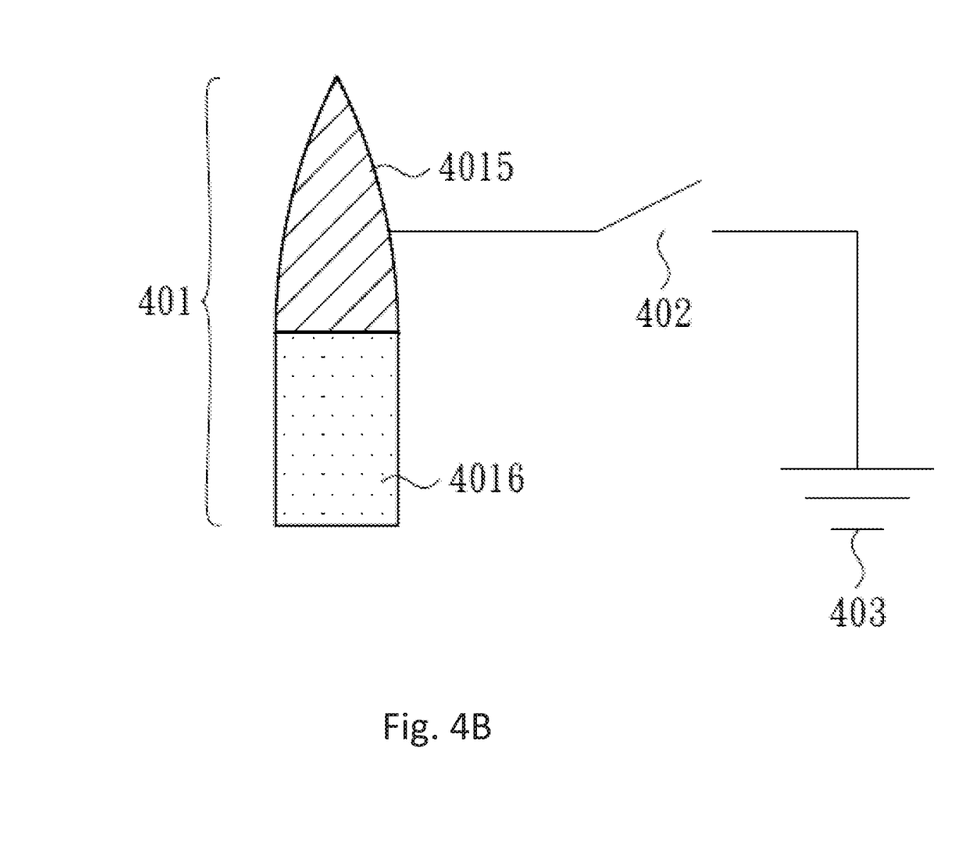

Some embodiments of the present invention are devices that eliminate electrical charges at a wafer. As shown in FIG. 4A, the device has at least one or more lift pins 401 and one or more switches 402. Any of the lift pins 401 is located inside the chuck 42 and may touch the wafer 41 located outside the chuck 42 (i.e., any lift pin 401 is accommodated in the chuck 42 and may extend outside the chuck 42). The switch 402 connect the lift pin 401 and zero electric potential point 403 makes it possible for controlling the lift pin 401 to be electrically connected to the zero electric potential point 403 by turning on or off the switch 402. Of course, for efficient operation, at least the lift pin 401 is connected to the portion of the zero electric potential point 403 and the tip of the lift pin 401 is contact the portion of the wafer, or even the entire lift pin 401 is formed of a conductor material. As shown in the FIG. 4B, in some embodiments of the present invention, a portion of the lift pin 401 is formed by a conductor material (or a conductive point 4015 of the lift pin 401) to ensure that the charges can pass from the wafer through the lift pin 401 to the switch 402, but the rest of the lift pin 402 is formed by the dielectric material (or the dielectric end 4016 of the lift pin 401) to ensure that the conduction and disconnection of the switch does not affect the hardware other than the wafer by the lift pin 402 (Such as a chuck 42 or even other hardware located in the reaction chamber and in contact with the chuck 42). Obviously, by controlling the on or off of the switch 402, it is possible to control the switch 402 to turn on to ground the wafer 41 and to conduct the charges at the wafer 41 to the zero electric potential point 403, or to control the switch 402 to turn off so that avoids the condition of the wafer 41 and the processing of the wafer 41 be affect when the switch 402 electrically connects to the zero electric potential point 403.

Figure 5:
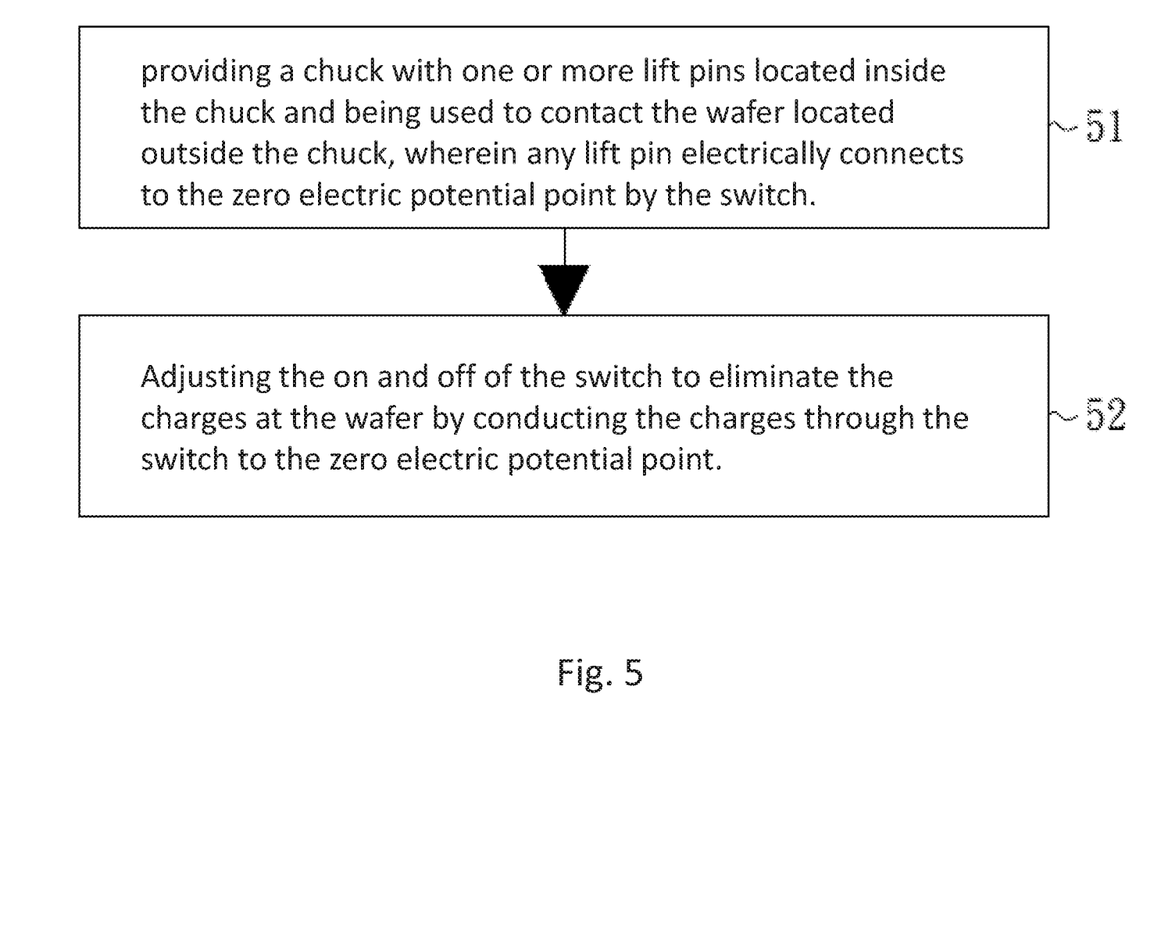
FIG. 5 is a schematic view of a method of eliminating the charges at the wafer by the present invention.

Some embodiments of the present invention are methods of eliminating charges at a wafer in accordance with the above described apparatus for eliminating charges at a wafer. In FIG. 5, as shown in the step block 5 and step block 52, providing a chuck with one or more lift pins located inside the chuck and being used to contact the wafer located outside the chuck, wherein any lift pin electrically connects to the zero electric potential point by the switch. Adjusting the on and off of the switch to eliminate the charges at the wafer by conducting the charges through the switch to the zero electric potential point.

For example, the switch 402 is turned on to ensure that the charges at the wafer 41 can be conducted to the zero electric potential point 403 to prevent the wafer 41 be sticky on the chuck 42, after the wafer is de-chucked, or when the chuck de-chuck the wafer, or when the wafer is removed from the chuck, or when the wafer is sticky on the chuck. For example, the switch 402 is turned off to ensure that the condition of the wafer and the processing of the wafer are not affected by electrically connecting of the wafer and the zero electric potential point, when the wafer is disposed on the chuck but is not held, or when the wafer is held by the chuck, or when the wafer is being processed (as in the case of ion implantation, etching, or deposition, etc.), or after the wafer is removed from the chuck.

For example, when performing the method of monitoring the relative relationship between the wafer and the chuck aforementioned, the switch in the apparatus that eliminates the charges at the wafer is turn off to ensure that the measurement of the capacitance-related signal is not affected by the switch connected to the zero electric potential, such as to avoid the corresponding AC signal output from the chuck passing through the switch to the zero electric potential point and affect the measurement of the capacitance-related signals.

For example, the switch can be turn off before the wafer is disposed on the chuck, and then before the wafer is removed from the chuck, especially when the wafer sticky is detected, turning on the switch to ensure that the charges at the wafer can be conduct to the zero electric potential point. Thereby, it is possible to substantially reduce the probability that the wafer cannot be properly and appropriately removed from the chuck due to the charges appearing on the wafer.

For example, when a wafer is disposed on a chuck, turning on the switch, especially during wafer processing. The switch is turned on in an interval that one process has been completed but the next process has not yet started, so that the charges accumulated at the wafer, either in the normal operation or in the event of an accident condition, is conducting to the zero electric potential point. Thereby, it is possible to reduce the probability that the wafer procession be affected by the charges accumulated at the wafer.

These embodiments of the present invention do not need to limit the number and position of the lift pins that are connected to the zero electric potential point by these switches. Although an option is to arrange the positions of these lift pins to correspond to the position where charges is more likely to accumulate at. For example, if the chuck is an electrostatic chuck having some electrodes, the positions of these lift pins may be arranged one-to-one adjacent to these electrodes.

These embodiments of the present invention do not need to limit the type and position of the switches that electrically connected to lift pins. All the switches needed are electrically connecting the lift pin to the zero electric potential point without high resistance when turning on and switches are isolated the lift pins and zero electric potential point without leakage when turning off. For example, if the operation of the chuck uses high voltage, the switches used in these embodiments of the present invention may be high voltage relays.

These embodiments of the present invention do not need to limit the details of the zero electric potential point to which the switch is electrically connected. For example, the zero electric potential point may be the zero potential point of the chuck, or zero electric potential point of the reaction chamber where the chuck located at, or zero electric potential point of the earth.

These embodiments of the present invention do not need to limit the material and contour of the lift pins that are connected to the zero electric potential point. For example, the part of these lift pins contact the wafer and the switch can be made of nickel, copper, or other highly conductive material. For example, the part of these lift pins do not contact with the wafer and the switch can be made of polyetheretherketone (PEEK) or other engineering plastics.

In particular, since the function of the lift pin used to push the wafer away from the chuck to be more sensitive and accurately measure the capacitance-related signal than prior art and the function of the lift pin used to remove the charges at the wafer by the switch electrical connection to the zero electric potential point is different, one embodiment of the present invention may use the same lift pins to measure the capacitance-related signal or to conduct the charges at the wafer to the zero electric potential point by turning off or turning on the switch respectively. Another embodiment of the present invention may use different lift pins to perform the measurement of the capacitance-related signal and the action of conducting the charges at the wafer to the zero electric potential point respectively.

For example, certain embodiments of the apparatus that eliminates the charges at the wafer further include a lift pin assembly that can extend to the outside of the chuck for holding the wafer, wherein the lift pin assembly includes one or more lift pins accommodated in the chuck and may extend outside the chuck and one or more support units respectively supporting and being used to move different lift pins. The lift pin assembly separates the wafer from the chuck to a distance. At least one of the lift pins has a conductive point contacted with the wafer and the switch and a dielectric end connected to the support unit.

Further, the apparatus for eliminating the charges at the wafer may be integrated with the apparatus of monitoring the relative relationship between the wafer and the chuck aforementioned. In other words, in some embodiments of the present invention, the apparatus for eliminating the charges at the wafer further includes a lift pine assembly that can extend to the outside of the chuck for holding the wafer, an AC signal generator for outputting the original AC signal, and a comparison circuit for comparing the original AC signal to the corresponding AC signal output from the chuck. Wherein the AC signal generator is electrically connected to the chuck and the comparison circuit respectively, and the comparison circuit is electrically connected to the AC signal generator and the chuck respectively. The lift pin assembly includes one or more lift pins accommodated in the chuck and can extend out of the chuck and one or more support units which are supporting and used to move different lift pins. The wafer can be separated from the chuck a distance and the corresponding AC signal changes with the distance. Determining whether the wafer sticky on the chuck on the comparison result of the comparison circuit. In some embodiments, at least one of the lift pins has a conductive point that may be in contact with the wafer and electrically connected to the switch (that is, at least one lift pin may be used to conduct the charges away from the wafer). The lift pin with conductive point has a dielectric end, where the dielectric end is connected to the support unit to ensure that the lift pin does not electrically connect the wafer and the switch (or the zero electric potential point) to the outside hardware from the apparatus. In some embodiments, at least one lift pin is dielectric pin or at least one lift pin has a dielectric point for mechanical contact with the wafer to reduce the probability of unexpectedly electrically connecting the wafer to the outside when separating the wafer and the chuck. In some embodiments, different lift pins may be mechanically contacted with the wafer respectively to separate the wafer and the chuck when de-chucked the wafer from the chuck. And at least one of the lift pins is mechanically supported by a spring, wherein the different lift pins are mechanically supported by different springs. In some embodiments, different lift pins may be mechanically contacted with the wafer respectively to separate the wafer and the chuck when de-chucked the wafer from the chuck. And at least one of the lift pins is mechanically supported by a spring, wherein the different lift pins are mechanically supported by different springs. And each spring is mechanically supported by a washer, wherein the different springs are mechanically supported by different washer respectively.

The above description is a preferred embodiment of the invention and it should be noted that it will be apparent to those skilled in the art that a number of improvements and modifications may be made without departing from the principles of the invention. These improvements and modifications also regarded as the scope of protection of the invention.

What is claimed is:

1. An apparatus for monitoring the relative relationship between a wafer and a chuck, comprising:
a lift pin assembly disposed in said chuck, wherein said lift pin assembly comprises at least one lift pin and at least one support unit supporting said lift pin, said lift pin has a first position accommodated inside said chuck and a second position extended outside said chuck to support said wafer;
an alternating current signal generator electrically connects to said chuck for generating an original alternating current signal to said chuck wherein said chuck generates a corresponding alternating current signal after received said original alternating current signal; and
a comparison circuit electrically connected to said alternating current signal generator and said chuck for receiving said original alternating current signal and said corresponding alternating current signal and comparing said original alternating current signal and said corresponding alternating current signal, wherein said wafer is apart from said chuck a distance when said lift pin is in said second position and said corresponding alternating current signal varies with said distance.

2. The apparatus for monitoring the relative relationship between a wafer and a chuck of claim 1, wherein said lift pin is mechanically touched said wafer in said second position to separate said wafer from said chuck when said wafer is de-chucked from said chuck.

3. The apparatus for monitoring the relative relationship between a wafer and a chuck of claim 2, wherein said support unit further comprises at least one spring for supporting said lift pin mechanically.

4. The apparatus for monitoring the relative relationship between a wafer and a chuck of claim 3, wherein said support unit further comprises at least one washer for supporting said lift pin mechanically.

5. The apparatus for monitoring the relative relationship between a wafer and a chuck of claim 2, wherein said lift pin is a dielectric lift pin.

6. The apparatus for monitoring the relative relationship between a wafer and a chuck of claim 2, wherein said lift pin comprises a dielectric point for touching said wafer mechanically.

* * * * *